ns US LLP

United States Patent
Yoo et al.

(10) Patent No.: US 10,403,850 B2
(45) Date of Patent: Sep. 3, 2019

(54) ENCAPSULATION FILM AND METHOD FOR ENCAPSULATING ORGANIC ELECTRONIC DEVICE USING SAME

(71) Applicant: LG CHEM, LTD., Seoul (KR)

(72) Inventors: Hyun Jee Yoo, Daejeon (KR); Seung Min Lee, Daejeon (KR); Hyun Suk Kim, Daejeon (KR); Suk Ky Chang, Daejeon (KR); Jung Ok Moon, Daejeon (KR)

(73) Assignee: LG Chem, Ltd., Seoul (KR)

( * ) Notice: Subject to any disclaimer, the term of this patent is extended or adjusted under 35 U.S.C. 154(b) by 620 days.

(21) Appl. No.: 14/892,110

(22) PCT Filed: May 21, 2014

(86) PCT No.: PCT/KR2014/004550
§ 371 (c)(1),
(2) Date: Nov. 18, 2015

(87) PCT Pub. No.: WO2014/189292
PCT Pub. Date: Nov. 27, 2014

(65) Prior Publication Data
US 2016/0093830 A1  Mar. 31, 2016

(30) Foreign Application Priority Data
May 21, 2013 (KR) .................. 10-2013-0057309

(51) Int. Cl.
*H01L 51/52* (2006.01)
*H01L 51/00* (2006.01)
*H01L 51/56* (2006.01)

(52) U.S. Cl.
CPC ........ *H01L 51/5253* (2013.01); *H01L 51/004* (2013.01); *H01L 51/0035* (2013.01); *H01L 51/0043* (2013.01); *H01L 51/5256* (2013.01); *H01L 51/56* (2013.01); *H01L 51/5243* (2013.01); *H01L 51/5259* (2013.01); *H01L 2251/303* (2013.01); *H01L 2251/558* (2013.01)

(58) Field of Classification Search
CPC ............ H01L 51/5253; H01L 51/0035; H01L 51/5256; H01L 51/5259; H01L 2251/303; H01L 51/56; H01L 2251/558; H01L 51/5243

USPC ............................................. 428/457; 257/40
See application file for complete search history.

(56) References Cited

U.S. PATENT DOCUMENTS

| | | | |
|---|---|---|---|
| 8,742,411 | B2 | 6/2014 | Yoo et al. |
| 2005/0280016 | A1* | 12/2005 | Mok ............... H01L 33/56 257/99 |
| 2011/0241528 | A1 | 10/2011 | Choi |
| 2012/0097982 | A1 | 4/2012 | Wakimoto et al. |
| 2012/0154707 | A1 | 6/2012 | Hsieh et al. |
| 2012/0248482 | A1* | 10/2012 | Lin ............... H01L 33/486 257/98 |
| 2012/0273975 | A1* | 11/2012 | Hayashishita .... H01L 21/67132 257/790 |
| 2013/0008506 | A1 | 1/2013 | Tanahashi et al. |
| 2013/0008613 | A1 | 1/2013 | Henderson |
| 2014/0167021 | A1 | 6/2014 | Arai et al. |

FOREIGN PATENT DOCUMENTS

| | | |
|---|---|---|
| CN | 1700823 A | 11/2005 |
| CN | 102763211 A | 10/2012 |
| EP | 2011639 A1 | 1/2009 |
| EP | 2637229 A2 | 9/2013 |
| EP | 2 799 509 A1 * | 11/2014 |
| GB | 2395358 A | 5/2004 |
| JP | 2004-111158 A | 4/2004 |
| JP | 2010097803 A | 4/2010 |
| JP | 2012-109226 A | 6/2012 |
| JP | 2012-229392 A | 11/2012 |
| KR | 10-0865445 B1 | 10/2008 |
| KR | 10-2012-0046704 A | 5/2012 |
| TW | 201236873 A1 | 9/2012 |
| WO | 2011027815 A1 | 3/2011 |
| WO | 2011086500 A2 | 7/2011 |
| WO | 2011/161586 A1 | 12/2011 |
| WO | 2012060621 A2 | 5/2012 |
| WO | WO 2013/100502 * | 7/2013 |

* cited by examiner

*Primary Examiner* — Doris L Lee
(74) *Attorney, Agent, or Firm* — Dentons US LLP

(57) ABSTRACT

Provided are an encapsulation film, a product for encapsulating an organic electronic device (OED) using the same, and a method of encapsulating an OED. The encapsulation film may effectively block moisture or oxygen permeating into the OED from an external environment, provide high reliability due to increases in a lifespan and durability of the OED, and minimize align errors in a process of attaching the film to a substrate.

15 Claims, 1 Drawing Sheet

ENCAPSULATION FILM AND METHOD FOR ENCAPSULATING ORGANIC ELECTRONIC DEVICE USING SAME

This application is a National Stage Entry of International Application No. PCT/KR2014/004550, filed May 21, 2014, and claims the benefit of and priority to Korean Application No. 10-2013-0057309, filed on May 21, 2013, both of which are hereby incorporated by reference in their entirety for all purposes as if fully set forth herein.

BACKGROUND

1. Field of the Invention

The present application relates to an encapsulation film and a method of encapsulating an organic electronic device (OED) using the same.

2. Discussion of Art

An OED is a device including an organic material layer generating exchange of charges using holes and electrons, and may be, for example, a photovoltaic device, a rectifier, a transmitter, and an organic light emitting diode (OLED).

An OLED among the OEDs consumes less power and has a higher response speed than conventional light sources, and is preferable as a thin display device or light. In addition, the OLED has excellent space utilization, and thus is expected to be applied in various fields including all kinds of portable devices, monitors, notebook computers, and TVs.

To expand commercialization and use of the OLED, the most important problem is durability. Organic materials and metal electrodes included in the OLED are very easily oxidized by external factors such as moisture. Accordingly, a product including the OLED is very sensitive to environmental factors. To solve the above-described problem, an encapsulant for an OED is applied. However, an automatic logistics process for a thin encapsulant is difficult, and defects such as align errors may easily occur in a process of attaching an encapsulant to a base substrate due to a gradually-shorter bezel. Accordingly, a method of solving the problems is needed.

SUMMARY OF THE INVENTION

The present application is directed to providing an encapsulation film, a product for encapsulating an OED using the same, and a method of encapsulating an OED.

Hereinafter, with reference to the accompanying drawings, exemplary embodiments of the present application will be described in further detail. In addition, to explain the present application, detailed descriptions for known general functions or configurations will be omitted. In addition, the accompanying drawings are schematically provided to help in understanding the present application, and to more clearly explain the present application, parts that do not relate to the descriptions will be omitted, thicknesses are exaggerated to clearly express several layers and regions, and the scope of the present application is not limited by thicknesses, sizes, and ratios shown in the drawings.

One aspect of the present application provides an encapsulation film which may be used to attach an entire surface of an OED. The encapsulation film includes a single-layered or multilayered encapsulating layer including a metal layer and an encapsulating resin.

The term "organic electronic device (OED)" used herein refers to a product or device having a structure including an organic material layer generating exchange of charges using holes and electrons between a pair of electrodes facing each other, and may be, but is not limited to, for example, a photovoltaic device, a rectifier, a transmitter, and an organic light emitting diode (OLED). In one exemplary embodiment of the present application, the OED may be an OLED.

According to an exemplary embodiment of the present application, the encapsulation film encapsulates an entire surface of the OED, and may include a metal layer, and an encapsulating layer including an encapsulating resin and having a tensile modulus of 0.001 to 500 MPa at room temperature.

A material for the encapsulating layer according to the present application is not particularly limited as long as it satisfies the range of the tensile modulus. The tensile modulus used herein is a tensile modulus measured at a temperature of 25° C. unless particularly defined otherwise. In addition, the tensile modulus used herein may refer to a tensile modulus of a curable component measured after curing unless particularly defined otherwise. In one example, the tensile modulus may refer to a tensile modulus measured after curing at approximately 100° C. for approximately 120 minutes, a tensile modulus measured after radiating UV rays at a radiation dose of approximately 1 J/cm² or more, or a tensile modulus measured after thermal curing is additionally performed after UV radiation.

As described above, the encapsulating layer may have a tensile modulus of 0.001 to 500 MPa at room temperature, and for example, 0.001 to 490 Mpa, 0.001 to 480 Mpa, 0.001 to 470 Mpa, 0.001 to 460 Mpa, 0.001 to 450 Mpa, 0.001 to 440 Mpa, 0.001 to 430 Mpa, 0.001 to 420 Mpa, 0.001 to 410 Mpa, 0.001 to 400 Mpa, 0.05 to 45 0 Mpa, 0.1 to 450 Mpa, 0.2 to 450 Mpa, 0.3 to 450 Mpa, or 0.5 to 450 Mpa. As the tensile modulus of the encapsulating layer is controlled within a specific range, a chance to have defects such as align errors of the encapsulation film going through a process at a specific temperature may be minimized.

The metal layer according to an exemplary embodiment of the present application may be transparent or opaque. A material for or a method of forming the metal layer is not particularly limited as long as it satisfies the above-described thermal expansion coefficient range. For example, the metal layer may be a thin film-type metal foil, or a layer formed by depositing a metal on a polymer layer. The metal layer may be any one that can have thermal conductivity and moisture preventability. The metal layer may include any one of a metal oxide, a metal nitride, a metal carbide, a metal oxynitride, a metal oxyboride, and a mixture thereof. For example, the metal layer may include a metal oxide such as silicon oxide, aluminum oxide, titanium oxide, indium oxide, tin oxide, indium tin oxide, tantalum oxide, zirconium oxide, niobium oxide, and a mixture thereof. The metal layer may be deposited by a means for electrolysis, rolling, evaporation, electron beam evaporation, sputtering, reactive sputtering, chemical vapor deposition, plasma chemical vapor deposition, or electron cyclotron resonance source plasma chemical vapor deposition.

The metal layer preferably has a thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. Due to the high thermal conductivity, heat generated at a junction interface in a metal layer junction process may be more rapidly emitted. In addition, the high thermal conductivity rapidly emits heat accumulated in operation of an OED to an external atmosphere, and thus a temperature of the OED can be maintained at a lower level, and cracks and defects can be reduced.

The metal layer according to one exemplary embodiment of the present application may include a polymer layer. The polymer layer may be, but is not limited to, a layer including a material selected from polyethyleneterephthalate, polytetrafluoroethylene, polyethylene, polypropylene, polybutene, polybutadiene, a vinyl chloride copolymer, polyurethane, ethylene-vinyl acetate, an ethylene-propylene copolymer, an ethylene-ethyl acrylate copolymer, an ethylene-methyl acrylate copolymer, polyimide, nylon, and a combination thereof as a polymer resin material. The polymer layer may prevent corrosion when in contact with moisture, and damage due to folding or bending during the process.

In an exemplary embodiment of the present application, a material for the encapsulation film is not particularly limited as long as the above-described metal layer and the encapsulating layer are included, and a structure of the encapsulating layer is not particularly limited, either. For example, the encapsulating layer may be formed in a single layer or a multiple layer of at least two layers. When the encapsulating layer is formed in a multilayer structure, each component constituting an encapsulating layers may be the same as or different from each other. Here, the component constituting the encapsulating layer may be an encapsulating resin, a moisture adsorbent, a curable material, or other additives.

In one example, the encapsulating resin may be a styrene-based resin or elastomer, a polyolefin-based resin or elastomer, other elastomers, a polyoxyalkylene-based resin or elastomer, a polyester-based resin or elastomer, a polyvinylchloride-based resin or elastomer, a polycarbonate-based resin or elastomer, a polyphenylenesulfide-based resin or elastomer, a mixture of hydrocarbon, a polyamide-based resin or elastomer, an acrylate-based resin or elastomer, an epoxy-based resin or elastomer, a silicon-based resin or elastomer, a fluorine-based resin or elastomer, or a mixture thereof.

Here, the styrene-based resin or elastomer may be, for example, a styrene-ethylene-butadiene-styrene (SEBS) block copolymer, a styrene-isoprene-styrene (SIS) block copolymer, an acrylonitrile-butadiene-styrene (ABS) block copolymer, an acrylonitrile-styrene-acrylate (ASA) block copolymer, a styrene-butadiene-styrene (SBS) block copolymer, a styrene-based homopolymer, or a mixture thereof. The olefin-based resin or elastomer may be, for example, a high-density polyethylene-based resin or elastomer, a low-density polyethylene-based resin or elastomer, a polypropylene-based resin or elastomer, or a mixture thereof. The elastomer may be, for example, an ester-based thermoplastic elastomer, an olefin-based elastomer, a silicon-based elastomer, an acryl-based elastomer, or a mixture thereof. Among these, the olefin-based thermoplastic elastomer may be a polybutadiene resin or elastomer or a polyisobutylene resin or elastomer. The polyoxyalkylene-based resin or elastomer may be, for example, a polyoxymethylene-based resin or elastomer, a polyoxyethylene-based resin or elastomer, or a mixture thereof. The polyester-based resin or elastomer may be, for example, a polyethylene terephthalate-based resin or elastomer, a polybutylene terephthalate-based resin or elastomer, or a mixture thereof. The polyvinylchloride-based resin or elastomer may be, for example, polyvinylidene chloride. The mixture of hydrocarbon may be, for example, hexatriacotane or paraffin. The polyamide-based resin or elastomer may be, for example, nylon. The acrylate-based resin or elastomer may be, for example, polybutyl(meth)acrylate. The epoxy-based resin or elastomer may be, for example, a bisphenol-type such as a bisphenol A-type, a bisphenol F-type, a bisphenol S-type, and a hydrogenated product thereof; a novolac-type such as a phenolnovolac-type or a cresol novolac-type; a nitrogen-containing ring-type such as a triglycidylisocyanurate-type or a hydantoin-type; an alicyclic-type; an aliphatic-type; an aromatic-type such as a naphthalene-type or a biphenyl-type; a glycidyl-type such as a glycidylether-type, a glycidylamine-type, or a glycidylester-type; a dicyclo-type such as a dicyclopentadiene-type; an ester-type; an etherester-type; or a mixture thereof. The silicon-based resin or elastomer may be, for example, polydimethylsiloxane. In addition, the fluorine-based rein or elastomer may be a polytrifluoroethylene resin or elastomer, a polytetrafluoroethylene resin or elastomer, a polychlorotrifluoroethylene resin or elastomer, a polyhexafluoropropylene resin or elastomer, polyvinylidene fluoride, polyvinyl fluoride, polyethylenepropylene fluoride, or a mixture thereof.

The listed resin or elastomer may be grafted with maleic anhydride, copolymerized with a monomer for preparing another listed resin or elastomer or a resin or an elastomer, and modified by another compound. The compound may be a carboxyl-terminated butadiene-acrylonitrile copolymer.

In one exemplary embodiment, as the encapsulating resin, a copolymer of an olefin-based compound including a carbon-carbon double bond may be included, but the present application is not limited.

In addition, the encapsulating resin may be a copolymer of a diene and an olefin-based compound including a carbon-carbon double bond. Here, the olefin-based compound may include isobutylene, propylene, or ethylene, the diene may be a monomer that can be polymerized with the olefin-based compound, and may include, for example, 1-butene, 2-butene, isoprene, or butadiene. That is, the encapsulating resin of the present application may be, for example, a homopolymer of an isobutylene monomer; a copolymer prepared by copolymerizing a monomer that can be polymerized with an isobutylene monomer; or a mixture thereof. In one example, a copolymer of an olefin-based compound including a carbon-carbon double bond and a diene may be butyl rubber.

The encapsulating resin may have a weight average molecular weight (Mw) as can be molded in the form of a film. For example, the resin may have a weight average molecular weight (Mw) of approximately 100,000 to 2,000,000, 100,000 to 1,500,000, or 100,000 to 1,000,000. The term "weight average molecular weight" refers to a conversion value for standard polystyrene measured by gel permeation chromatography (GPC). However, the resin or elastomer component may not have the above-described weight average molecular weight. For example, when the molecular weight of the resin or elastomer component is not in a sufficient level to form a film, a separate binder resin may be added to a component constituting an encapsulating layer.

In yet another embodiment, the encapsulating resin may include a curable resin. In one example, components constituting the above-described encapsulating layer is not particularly limited as long as the encapsulating layer satisfies the tensile modulus or glass transition temperature, and may include, for example, a curable resin. In one example, the curable resin may be included as a component constituting a second layer of the encapsulating layer, which will be described below.

A specific kind of the curable resin that can be used in the present application is not particularly limited, and for example, various heat-curable or photocurable resins known in the art may be used. The "heat-curable resin" used herein refers to a resin that can be cured by suitable heat application or an aging process, and the term "photocurable resin" refers to a resin that can be cured by radiation of electromagnetic waves. In addition, here, in the category of the electromagnetic waves, microwaves, IR rays, UV rays, X rays, γ rays. and particle beams such as α-particle beams, proton beams, neutron beams, and electron beams may be included. In the present application, as an example of the photocurable resin, a cationic photocurable resin may be used. The cationic photocurable resin refers to a resin that can be cured by cationic polymerization or a cationic curing reaction induced by radiation of electromagnetic waves. In addition, the curable resin may be a dual curable resin having both heat-curable and photocurable characteristics.

A specific kind of a curable resin that can be used in exemplary embodiments of the present application is not particularly limited, as long as the curable resin has the above-described characteristics. For example, a resin that can be cured to exhibit adhesive characteristics may include a resin including at least one heat-curable functional group selected from a glycidyl group, an isocyanate group, a hydroxyl group, a carboxyl group, or an amide group, or at least one functional group capable of being cured by the radiation of an electromagnetic wave, selected from an epoxide group, a cyclic ether group, a sulfide group, an acetal group, and a lactone group. In addition, a specific kind of the resin may include an acryl resin, a polyester resin, an isocyanate resin, or an epoxy resin, but the present application is not limited thereto.

As the curable resin in the present application, an aromatic or aliphatic, or a linear or branched epoxy resin may be used. In one exemplary embodiment of the present application, an epoxy resin containing at least two functional groups and an epoxy equivalent of 180 to 1,000 g/eq may be used. When the epoxy resin having the above epoxy equivalent is used, characteristics such as adhesive performance and a glass transition temperature of the cured product may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a 4-functional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin, and a dicyclopentadiene-modified phenol-type epoxy resin.

In the present application, preferably, an epoxy resin including a cyclic structure in a molecular structure may be used, and more preferably, an epoxy resin including an aromatic group (for example, a phenyl group) may be used. When the epoxy resin includes an aromatic group, a cured product may have excellent thermal and chemical stabilities and low moisture absorption, thereby enhancing reliability of the encapsulation structure of the OED. Specifically, an example of the epoxy resin containing an aromatic group that can be used in the present application may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin, and an alkyl-modified triphenolmethane epoxy resin.

In the specification, preferably, the epoxy resin is a silane-modified epoxy resin, and more preferably, a silane-modified epoxy resin having an aromatic group. Likewise, when an epoxy resin modified with a silane to structurally have a silane group is used, an adhesive property of the OED to a glass substrate or a substrate inorganic material is maximized, and a moisture barrier property or durability and reliability may be enhanced. Such a specific kind of the epoxy resin that can be used in the present application is not particularly limited, and the resin may be easily obtained from a manufacturer, for example, Kukdo Chemical, Co., Ltd.

As described above, the encapsulating layer may include a single layer or a multiple layer having at least two layers. When the encapsulating layer is formed of a single layer, a tensile modulus of the encapsulating layer is as described above. In addition, when the encapsulating layer is formed of at least two layers, at least one layer may have a tensile modulus of 0.001 to 500 MPa at room temperature. In addition, when the encapsulating layer includes at least two layers, the encapsulating layer may include a first layer having a tensile modulus of 0.001 to 500 MPa at room temperature, and a second layer having a tensile modulus of 500 to 1000 MPa at room temperature. When an organic electronic diode is encapsulated with at least two layers, a stacked sequence is not particularly limited, but a layer including or not including a small amount of a moisture adsorbent that will be described below may be in contact with the organic electronic diode.

In an exemplary embodiment of the present application, the encapsulating layer may further include a moisture adsorbent. The term "moisture adsorbent" may refer to any component that can adsorb or remove moisture or vapor permeating from an external environment through a physical or chemical reaction. That is, the moisture adsorbent means a moisture reactive or physical adsorbent, or a mixture thereof.

The moisture reactive adsorbent chemically reacts with vapor, moisture, or oxygen permeating into the encapsulating layer to adsorb moisture or vapor. The physical adsorbent may extend a path of moisture or vapor permeating into the encapsulation structure to prevent the permeation, and maximize preventability to moisture and vapor through a matrix structure of the encapsulating resin and an interaction with the moisture reactive adsorbent.

The specific kind of the moisture adsorbent that can be used in the present application may be, but is not particularly limited to, one or a mixture of at least two of metal powder such as alumina, a metal oxide, a metal salt, or phosphorus pentoxide ($P_2O_5$) in the case of the moisture reactive adsorbent, and silica, zeolite, titania, zirconia, or montmorillonite in the case of the physical adsorbent.

Here, specifically, the metal oxide may be phosphorus pentoxide ($P_2O_5$), lithium oxide ($Li_2O$), sodium oxide ($Na_2O$), barium oxide (BaO), calcium oxide (CaO), or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$), or magnesium iodide ($MgI_2$); or a metal chlorate such as barium perchlorate ($Ba(ClO_4)_2$) or magnesium perchlorate ($Mg(ClO_4)_2$).

In the present application, the moisture adsorbent such as the metal oxide may be suitably processed, and added to the composition. For example, depending on the kind of the OED to which the encapsulation film is applied, the encapsulating layer may be a thin film having a thickness of 30 μm or less, and in this case, a grinding process of the moisture adsorbent may be needed. To grind the moisture adsorbent, three-roll milling, bead milling, or ball milling may be used. In addition, when the encapsulation film of the present application is used in a top-emissive OED, a permeability of the encapsulating layer is very important, and thus the moisture adsorbent should have a small size. Accordingly, for such a use, the grinding process may also be needed.

The encapsulating layer of the present application may include a moisture adsorbent at 1 to 100 parts by weight, and preferably 5 to 50 parts by weight relative to 100 parts by weight of the encapsulating resin. As the content of the moisture adsorbent is controlled to 5 parts by weight or more, the encapsulating layer may exhibit excellent moisture and vapor preventabilities. In addition, as the content of the moisture adsorbent is controlled to 50 parts by weight or less, the encapsulating layer may be formed in a thin film having an encapsulation structure, and exhibit excellent moisture preventability. However, the content range may be suitably controlled according to a location of the encapsulating layer without particular limitation. For example, the moisture adsorbent in a region of the encapsulating layer, which is close to the OED may be included in a smaller amount, and may be included, for example, at 0 to 20% based on a total amount of the moisture adsorbent. When the content is more than 20%, the moisture adsorbent may induce a physical damage by pressing the OED along with impurities, and induce a chemical damage to a negative electrode or an inorganic protective layer due to an excessive amount of ionic materials released after the reaction with moisture.

In the specification, unless particularly defined otherwise, the unit "parts by weight" means a weight ratio between components.

In an exemplary embodiment of the present application, the encapsulating layer may further include a tackifier according to the kind of the encapsulating resin. For example, the encapsulating layer may further include a tackifier, in addition to the above-described encapsulating resin. The tackifier may be, for example, a hydrogenated petroleum resin obtained by hydrogenating a petroleum resin. The hydrogenated petroleum resin may be partially or completely hydrogenated, and may be a mixture of such resins. Such a tackifier may have high compatibility with a component constituting the encapsulating layer and an excellent moisture preventability. The specific hydrogenated petroleum resin may be a hydrogenated terpene-based resin, a hydrogenated ester-based resin, or a hydrogenated dicyclopentadiene-based resin. The tackifier may have a weight average molecular weight of approximately 200 to 5,000. A content of the tackifier may be suitably controlled as needed. For example, the tackifier may be included in a first layer at 5 to 100 parts by weight relative to 100 parts by weight of the encapsulating resin.

The encapsulating layer may include various additives according to a use of the film and a process of manufacturing a film, in addition to the above-described components. For example, in consideration of durability and processability, a curable material may be further included in the encapsulating layer. Here, the curable material may mean a material having a heat-curable functional group and/or an active energy beam-curable functional group separately included in addition to the components constituting the encapsulating layer. In addition, a content of the curable material included in the encapsulating layer may be controlled according to a desired physical property of the film.

In an exemplary embodiment of the present application, the encapsulating layer may further include a curing agent according to the kind of the encapsulating resin. For example, through a reaction with the above-described encapsulating resin, a curing agent that can form a crosslinking structure or an initiator that can initiate a curing reaction of the resin may further be included.

A suitable kind of the curing agent may be selected and used depending on the kind of the encapsulating resin or a functional group included in the resin.

In one example, when the encapsulating resin is an epoxy resin, as the curing agent, for example, a curing agent of an epoxy resin known in the art, for example, at least one or two of an amine curing agent, an imidazole curing agent, a phenol curing agent, a phosphorous curing agent, and an acid anhydride curing agent may be used, but the present application is not limited.

In one example, the curing agent may be an imidazole compound which is a solid at room temperature, and has a melting point or a degradation temperature of 80° C. or more. Such a compound may be, but is not limited to, 2-methyl imidazole, 2-heptadecyl imidazole, 2-phenyl imidazole, 2-phenyl-4-methyl imidazole, or 1-cyanoethyl-2-phenyl imidazole.

A content of the curing agent may be selected according to components of the composition, for example, a kind or ratio of the encapsulating resin. For example, the curing agent may be included at 1 to 20 parts by weight, 1 to 10 parts by weight, or 1 to 5 parts by weight relative to 100 parts by weight of the encapsulating resin. However, the weight ratio may be changed according to a kind and a ratio of the encapsulating resin or a functional group of the resin, or a crosslinking density to be realized.

When the encapsulating resin is a resin that can be cured by radiation of active energy beams, as an initiator, for example, a cationic photopolymerization initiator may be used.

As the cationic photopolymerization initiator, an onium salt or organometallic salt-series ionized cationic initiator, or an organic silane-series or latent sulfonic acid-series initiator, or a non-ionized cationic photopolymerization initiator may be used. The onium salt-series initiator may be a diaryliodonium salt, a triarylsulfonium salt, or an aryldiazonium salt, the organometallic salt-series initiator may be iron arene, the organic silane-series initiator may be o-nitrobenzyl triaryl silyl ether, triaryl silyl peroxide, or acyl silane, and the latent sulfonic acid-series initiator may be α-sulfonyloxy ketone or α-hydroxymethylbenzoin sulfonate, but the present application is not limited thereto.

In one example, as the cationic initiator, an ionized cationic photopolymerization initiator may be used.

In addition, when the encapsulating resin is a resin that can be cured by radiation of active energy beams, as the initiator, for example, a radical initiator may be used.

The radical initiator may be a photoinitiator or a thermal initiator. A specific kind of the photoinitiator may be suitably selected in consideration of a curing speed and yellowing probability. For example, the photoinitiator may be a benzoin-, hydroxy ketone-, amino ketone-, or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxy cyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylamino benzophenone, dichlorobenzophenone, 2-methylanthraquinone, 2-ethylanthraquinone, 2-t-butylanthraquinone, 2-amino anthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide.

A content of the initiator, like the curing agent, may be changed according to the kind and ratio of the encapsulating resin or a functional group of the resin, or a crosslinking density to be realized. For example, the initiator may be included at 0.01 to 10 parts by weight or 0.1 to 3 parts by weight relative to 100 parts by weight of the encapsulating resin. When the content of the initiator is too small, curing may not sufficiently occur, and when the content of the initiator is too large, a content of an ionic material is increased after curing to deteriorate durability of an adhesive, or due to the characteristic of the initiator, a conjugate acid is formed, which is disadvantageous in terms of optical durability, and corrosion may occur according to a base substrate, thereby selecting a suitable content range in consideration of such a problem.

The encapsulating layer may include various materials according to a use of the film and a process of manufacturing a film. For example, when the encapsulating layer is molded in a film or sheet type, in consideration of moldability, a binder resin may be included in the encapsulating layer.

In one exemplary embodiment of the present application, the encapsulating layer may include a filler, and preferably, an inorganic filler. The filler may extend a path of moisture or vapor permeating into the encapsulation structure to prevent the permeation, and maximize preventability to moisture and vapor through an interaction with the encapsulating resin and the moisture adsorbent. A specific kind of the filler that can be used in the present application may be, but is not particularly limited to, for example, one or a mixture of at least two of clay, talc, and needle-like silica.

In the present application, to increase a binding efficiency between a filler and an organic binder, as the filler, a product which is surface-treated with an organic material may be used, or a coupling agent may be further added.

The encapsulating layer of the present application may include a filler at 1 to 50 parts by weight, and preferably 1 to 20 parts by weight relative to 100 parts by weight of the encapsulating resin. As the content of the filler is controlled to 1 part by weight or more, a cured product having an excellent moisture or vapor blocking property and excellent mechanical properties may be provided. In addition, in the present application, as the content of the filler is controlled to 50 parts by weight or less, a film-type encapsulating layer can be manufactured, and although the encapsulating layer is formed in a thin film, an encapsulation structure exhibiting an excellent moisture blocking characteristic may be provided.

The encapsulation film of the present application may have, but not particularly limited, a structure including, for example, a base or releasing film (hereinafter, can be referred to as a "first film"); and the encapsulating layer formed on the base or releasing film as long as including the metal layer and the encapsulating layer.

FIGS. 1 to 2 are cross-sectional views of an encapsulation film according to an exemplary embodiment of the present application.

As shown in FIG. 1, the encapsulation film of the present application may include an encapsulating layer 12 and a metal layer 13 which are formed on a base or releasing film 11. In addition, in FIG. 2, the encapsulating layer 12 includes a first layer 12a and a second layer 12b.

A specific kind of the first film that can be used in the present application is not particularly limited. In the present application, as the first film, for example, a general polymer film in the art may be used. In the present application, for example, as the base or releasing film, a polyethyleneterephthalate film, a polytetrafluorethylene film, a polyethylene film, a polypropylene film, a polybutene film, a polybutadiene film, a vinylchloride copolymer film, a polyurethane film, an ethylene-vinyl acetate film, an ethylene-propylene copolymer film, an ethylene-acrylic acid ethyl copolymer film, an ethylene-acrylic acid methyl copolymer film, or a polyimide film may be used. In addition, one or both surfaces of the base or releasing film of the present application may be subjected to suitable releasing treatment. As an example of a releasing agent used in the releasing treatment of the base film, an alkyd-, silicon-, fluorine-, unsaturated ester-, polyolefin-, or wax-based releasing agent may be used, and among these, in terms of heat resistance, an alkyd-, silicon-, or fluorine-based releasing agent is preferably used, but the present application is not limited thereto.

In the present application, a thickness of the base or releasing film (the first film) is not particularly limited, and may be suitably selected according to an application. For example, in the present application, the first film may have a thickness of approximately 10 to 500 μm, and preferably, 20 to 200 μm. When the thickness is less than 10 μm, the base film may be easily modified in the manufacturing process, and when the thickness is more than 500 μm, economic feasibility is degraded.

The thickness of the encapsulating layer included in the encapsulation film of the present application is not particularly limited, and in consideration of an application of the film, may be suitably selected according to the following conditions. The thickness of the encapsulating layer may be approximately 5 to 200 μm, and preferably, 5 to 100 μm. When the thickness of the encapsulating layer is less than 5 μm, it may not exhibit sufficient moisture preventability, and when the thickness of the encapsulating layer is more than 200 μm, processability is difficult to be ensured, and thickness expansion is increased due to moisture reactivity, thereby damaging a deposition film of the OED, and decreasing economic feasibility.

Another aspect of the present application provides a method of manufacturing an encapsulation film. The exemplary encapsulation film may be manufactured by molding the encapsulating layer in a film or sheet type.

In one example, the method may include applying a coating solution including components constituting the above-described encapsulating layer on a base or releasing film in a sheet or film type, and drying the applied coating solution.

The coating solution may be prepared by, for example, dissolving or dispersing the components of the above-described encapsulating layer in a suitable solvent. In one example, the encapsulating layer may be manufactured by a method of dissolving or dispersing the moisture adsorbent or filler in a solvent when needed, grinding the moisture adsorbent or filler and mixing the grinded moisture adsorbent or filler with an encapsulating resin.

A kind of the solvent used in the preparation of a coating solution is not particularly limited. However, when a drying time of the solvent is excessively long, or drying at a high temperature is needed, problems may be generated in terms of workability or durability of the encapsulation film, and thus a solvent having a volatile temperature of 150° C. or less may be used. In consideration of film moldability, a small amount of the solvent having a volatile temperature in the range or more may be mixed and used. The solvent may be, but is not limited to, at least one or two of methylethylketone (MEK), acetone, toluene, dimethylformamide (DMF), methylcellosolve (MCS), tetrahydrofuran (THF), xylene, or N-methylpyrrolidone (NMP).

A method of applying the coating solution to the base or releasing film may be, but is not particularly limited to, a known coating method such as knife coating, roll coating, spray coating, gravure coating, curtain coating, comma coating, or lip coating.

The applied coating solution may be dried, and the solvent may be volatilized, thereby forming an encapsulating layer. The drying may be performed, for example, at 70 to 150° C. for 1 to 10 minutes. The drying condition may be changed in consideration of a kind of the used solvent.

After the drying, a metal layer may be formed on the encapsulating layer. The metal layer may be formed using a known technique in the art. For example, the metal layer may be formed of a metal foil or by depositing a metal on a polymer layer. For example, the metal layer may be formed by electrolysis or rolling.

Still another aspect of the present application provides a product for encapsulating an OED, which includes a substrate, an OED formed on the substrate, and the above-described encapsulation film encapsulating the OED, in which the encapsulation film is attached to an entire surface of the OED.

In the present application, the OED may be an OLED.

The product for encapsulating the OED may further include a protective film between the encapsulation film and the OED to protect the OED.

In one example, as shown in FIG. 3, the product for encapsulating the OED may be disposed such that the encapsulating layer 12 of the encapsulation film is in contact with an OED 22 and a substrate 21. In addition, the metal layer 13 may be disposed on the encapsulating layer 12.

Yet another aspect of the present application provides a method of encapsulating an OED, which includes applying the above-described encapsulating layer of the encapsulation film to a substrate on which the OED is formed to be attached to an entire surface of the OED, and curing the encapsulating layer.

The encapsulation film may be applied to the OED by hot roll lamination, hot pressing, or vacuum pressing of the encapsulation film, but the present application is not particularly limited thereto.

In the present application, according to the method of encapsulating the OED, for example, a transparent electrode is formed on the substrate such as a glass or a polymer film by vacuum deposition or sputtering, and an organic material layer is formed on the transparent electrode. The organic material layer may include a hole injection layer, a hole transport layer, an emitting layer, an electron injection layer, and/or an electron transport layer. Subsequently, a second electrode is further formed on the organic material layer. Afterward, the above-described encapsulation film is applied to a top surface of the OED 22 on the substrate 21 to cover an entire surface of the OED 22. Here, a method of applying the encapsulation film may be, but is not particularly limited to, a method of applying the encapsulation film of the present application to a top surface of the OED 22 formed on the substrate 21 through heating, pressing, or autoclaving.

In addition, an additional curing process or adhesion-enhancing process to the encapsulation film to which the OED 22 is pressed may be performed, and such a process (main curing) may be performed, for example, in a heating chamber. A curing condition in the main curing may be suitably selected in consideration of stability of the OED 22.

However, the above-described forming process is merely an example for encapsulating the OED 22, and thus a sequence of or condition for the process may be freely changed. In addition, after the protective layer is formed on the OED 22, the encapsulation film may be applied and then cured.

EFFECTS

An encapsulation film of the present application can effectively block moisture or oxygen permeating into an OED from an external environment, provide high reliability due to increases in a lifespan and durability of the OED, remove a process of attaching an encapsulating resin to an encap material by integrating an encap material with an encapsulating resin, and minimize align errors in a process of attaching an encapsulation film to a substrate.

DETAILED DESCRIPTION OF EXEMPLARY EMBODIMENTS

Figure 1:
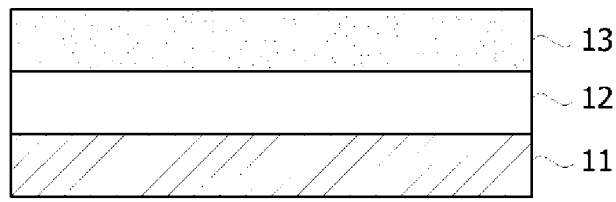
FIGS. 1 and 2 are cross-sectional views of an encapsulation film according to an exemplary embodiment of the present application.
Figure 2:
Figure 3:
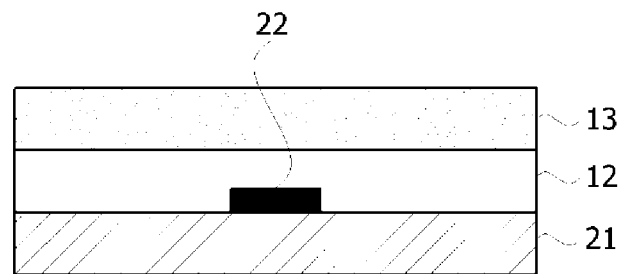
FIG. 3 is a cross-sectional view of an encapsulation product of an OED according to an exemplary embodiment of the present application.

Hereinafter, the present invention will be described in further detail with reference to Examples according to the present invention and Comparative Examples not according to the present invention, but the scope of the present invention is not limited to the following Examples.

EXAMPLE 1

(1) Preparation of Encapsulating Layer (First Layer)

100 g of a silane-modified epoxy resin (KSR-177, Kukdo Chemical Co., Ltd.), 100 g of a butadiene rubber-modified epoxy resin (KR-450, Kukdo Chemical Co., Ltd.), and 150 g of a phenoxy resin (YP-50, Tohto Kasei Co., Ltd.) were added to a reaction vessel at room temperature, and diluted with methylethylketone (MEK). 4 g of imidazole (Shikoku Chemicals Co., Ltd.) was added as a curing agent to the homogenized solution, and stirred at a high speed for 1 hour, resulting in a solution for a first layer.

(2) Preparation of Encapsulating Layer (Second Layer)

A moisture adsorbent solution was prepared by adding 100 g of calcined dolomite as a moisture adsorbent and MEK having a solid content of 50 wt % as a solvent. 200 g of a silane-modified epoxy resin (KSR-177, Kukdo Chemical Co., Ltd.) and 150 g of a phenoxy resin (YP-50, Tohto Kasei Co., Ltd.) were added to a reaction vessel at room temperature, and diluted with MEK. 4 g of imidazole (Shikoku Chemicals Co., Ltd.) was added as a curing agent to the homogenized solution, and the resulting solution was stirred at a high speed for 1 hour, and thus a solution for a moisture barrier layer was prepared. The moisture adsorbent solution previously prepared was added to the resulting solution to have a content of the calcined dolomite of 50 parts by weight relative to 100 parts by weight of an encapsulating resin of a second layer, resulting in preparing a solution for a second layer.

(3) Manufacture of Film

A second layer having a thickness of 40 μm was formed by coating the solution for the moisture barrier layer previously prepared on a releasing surface of releasing PET, and drying the coated surface at 110° C. for 10 minutes. An encapsulation film was manufactured by manufacturing a multilayer film by laminating the first and second layers previously prepared, and laminating the multilayer film with a 20 μm copper film.

EXAMPLE 2

An encapsulation film was manufactured by the same method as described in Example 1, except that 100 g of a silane-modified epoxy resin (KSR-177, Kukdo Chemical Co., Ltd.), 100 g of an acryl rubber-modified epoxy resin (KR-692, Kukdo Chemical Co., Ltd.), and 150 g of a phenoxy resin (YP-50, Tohto Kasei Co., Ltd.) were added to a reaction vessel at room temperature and diluted with MEK, and 4 g of imidazole (Shikoku Chemicals Co., Ltd.) was added as a curing agent to the homogenized solution and stirred at a high speed for 1 hour, resulting in a solution for a first layer.

EXAMPLE 3

An encapsulation film was manufactured by the same method as described in Example 1, except that 50 g of a polyisobutene resin (weight average molecular weight: 450,000) as an encapsulating resin of a first layer and 50 g of a hydrogenated dicyclopentadiene-based resin (softening point: 125° C.) as a tackifier were added into a reaction vessel at room temperature, and 10 g of a DCPD-based epoxy resin and 1 g of imidazole (Shikoku Chemicals Co., Ltd.) were diluted with toluene to have a solid content of approximately 30 wt %.

EXAMPLE 4

An encapsulation film was manufactured by the same method as described in Example 1, except that 50 g of a polyisobutene resin (weight average molecular weight: 450,000) as an encapsulating resin of a crack barrier layer and 50 g of a hydrogenated dicyclopentadiene-based resin (softening point: 125° C.) as a tackifier were added into a reaction vessel at room temperature, and 20 g of a multifunctional acryl monomer (TMPTA) and 1 g of a photoinitiator were diluted with toluene to have a solid content of approximately 25 wt %.

EXAMPLE 5

A moisture adsorbent solution was prepared by adding 100 g of calcined dolomite as a moisture adsorbent and toluene as a solvent to have a solid content of 50 wt %. An encapsulation film was manufactured by the same method as described in Example 1, except that 50 g of a polyisobutene resin (weight average molecular weight: 450,000) as an encapsulating resin of a first layer and 50 g of a hydrogenated dicyclopentadiene-based resin (softening point: 125° C.) as a tackifier were added into a reaction vessel at room temperature, and 10 g of a multifunctional acryl monomer (TMPTA) and 1 g of a photoinitiator were diluted with toluene to have a solid content of approximately 25 wt %, and a second layer was excluded.

EXAMPLE 6

An encapsulation film was manufactured by laminating the encapsulating layer formed in the first layer of Example 5 on an aluminum film.

COMPARATIVE EXAMPLE 1

An encapsulation film was manufactured by the same method as described in Example 1, except that 200 g of a silane-modified epoxy resin (KSR-177, Kukdo Chemical Co., Ltd.) and 150 g of a phenoxy resin (YP-50, Tohto Kasei Co., Ltd.) were added to a reaction vessel at room temperature, and diluted with MEK, and a solution for a first layer was prepared by adding 4 g of imidazole (Shikoku Chemicals Co., Ltd.) as a curing agent to the homogenized solution, and stirring the resulting solution at a high speed for 1 hour.

COMPARATIVE EXAMPLE 2

An encapsulation film was manufactured by the same method as described in Example 1, except that an encapsulating layer formed of only the second layer of Example 1 was used.

1. Measurement of Tensile Modulus

A coating film having a thickness of 40 μm was formed by laminating the crack barrier layer or moisture barrier layer manufactured in Example or Comparative Example. A sample was prepared by cutting the manufactured coating film to a size of 50 mm×10 mm (length×width) by setting a coating direction in the manufacture to a length direction, and both sides of the sample were taped to only have a length of 25 mm. Subsequently, the taped parts were extended at a speed of 18 mm/min at 25° C., and a tensile modulus was measured.

2. Measurement of Warpage in Evaluation of High Temperature and High Humidity Reliability A sample was manufactured by laminating the film manufactured in Example or Comparative Example on a cover substrate, laminating the resulting substrate between glass substrates, and pressured and thermal pressing the resulting product at 70° C. Afterward, the sample was maintained in a constant temperature and constant humidity chamber at 85° C. and a relative humidity of 85% for approximately 300 hours. When warpage occurred, it was represented as X, and when warpage did not occur, it was represented as O.

TABLE 1

| | Tensile modulus of second layer | Tensile modulus of first layer | Adhesion failure in evaluation of high temperature and high humidity reliability |
| --- | --- | --- | --- |
| Example 1 | 650 MPa | 400 MPa | ○ |
| Example 2 | 900 MPa | 450 MPa | ○ |

TABLE 1-continued

|  | Tensile modulus of second layer | Tensile modulus of first layer | Adhesion failure in evaluation of high temperature and high humidity reliability |
|---|---|---|---|
| Example 3 | 900 MPa | 100 MPa | ○ |
| Example 4 | 900 MPa | 10 MPa | ○ |
| Example 5 | — | 10 MPa | ○ |
| Example 6 | — | 10 MPa | ○ |
| Comparative Example 1 | 1 GPa | 900 MPa | X |
| Comparative Example 2 | 900 MPa | — | X |

DESCRIPTION OF REFERENCE NUMERALS

11: base or releasing film
12: encapsulating layer
12a: a first layer
12b: a second layer
13: metal layer
21: substrate
22: organic electronic device

What is claimed is:

1. An encapsulation film for encapsulating an organic electronic device, comprising:
   a metal layer; and
   an encapsulating layer comprising an encapsulating resin, and having a tensile modulus of 0.001 to 500 MPa at room temperature,
   wherein the metal layer further comprises an additional layer, and said additional layer includes a material selected from the group consisting of polyethyleneterephthalate, polytetrafluoroethylene, polyethylene, polypropylene, polybutene, polybutadiene, vinyl chloride copolymer, polyurethane, ethylene-vinyl acetate, ethylene-propylene copolymer, ethylene-ethyl acrylate copolymer, ethylene-methyl acrylate copolymer, polyimide, nylon, and a combination thereof.

2. The encapsulation film according to claim 1, wherein the metal layer has a thermal conductivity of 50 W/mK or more.

3. The encapsulation film according to claim 1, wherein the metal layer comprises any one of a metal oxide, a metal nitride, a metal carbide, a metal oxynitride, a metal oxyboride, and a mixture thereof.

4. The encapsulation film according to claim 3, wherein the metal layer comprises any one of silicon oxide, aluminum oxide, titanium oxide, indium oxide, tin oxide, indium tin oxide, tantalum oxide, zirconium oxide, niobium oxide, and a mixture thereof.

5. The encapsulation film according to claim 1, wherein the encapsulating resin is a styrene-based resin, a polyolefin-based resin, a thermoplastic elastomer, a polyoxyalkylene-based resin, a polyester-based resin, a polyvinylchloride-based resin, a polycarbonate-based resin, a polyphenylenesulfide-based resin, a mixture of hydrocarbon, a polyamide-based resin, an acrylate-based resin, an epoxy-based resin, a silicon-based resin, a fluorine-based resin, or a mixture thereof.

6. The encapsulation film according to claim 1, wherein the encapsulating layer further comprises a moisture adsorbent.

7. The encapsulation film according to claim 1, wherein the encapsulating layer is formed in a single layer or at least two layers.

8. The encapsulation film according to claim 7, wherein when the encapsulating layer is formed in at least two layers, at least one layer has a tensile modulus of 0.001 to 500 MPa at room temperature.

9. The encapsulation film according to claim 1, wherein the encapsulating resin comprises a curable resin.

10. The encapsulation film according to claim 9, wherein the curable resin comprises at least one curable functional group selected from a glycidyl group, an isocyanate group, a hydroxyl group, a carboxyl group, an amide group, an epoxide group, a cyclic ether group, a sulfide group, an acetal group, and a lactone group.

11. The encapsulation film according to claim 9, wherein the curable resin is an epoxy resin comprising a cyclic structure in a molecular structure.

12. The encapsulation film according to claim 9, wherein the curable resin is a silane-modified epoxy resin.

13. A product for encapsulating an organic electronic device, comprising:
   a substrate;
   an organic electronic device formed on the substrate; and
   the encapsulation film according to claim 1 to encapsulate the organic electronic device,
   wherein an encapsulating layer of the encapsulation film is attached to an entire surface of the organic electronic device.

14. The product according to claim 13, wherein the organic electronic device is an organic light emitting diode.

15. A method of encapsulating an organic electronic device, comprising:
   applying an encapsulating layer of the encapsulation film according to claim 1 to a substrate on which an organic electronic device is formed to be attached to an entire surface of the organic electronic device; and
   curing the encapsulating layer.

* * * * *